(12) United States Patent
Newman et al.

(10) Patent No.: US 10,258,959 B2
(45) Date of Patent: Apr. 16, 2019

(54) METHODS OF PRODUCING HETERODIAMOND AND APPARATUS THEREFOR

(71) Applicants: Arnold L. Newman, Bethesda, MD (US); Daniel Hodes, Great Falls, VA (US)

(72) Inventors: Arnold L. Newman, Bethesda, MD (US); Daniel Hodes, Great Falls, VA (US)

(73) Assignee: Unit Cell Diamond LLC, Bethesda, MD (US)

( * ) Notice: Subject to any disclaimer, the term of this patent is extended or adjusted under 35 U.S.C. 154(b) by 0 days.

(21) Appl. No.: 14/934,679

(22) Filed: Nov. 6, 2015

(65) Prior Publication Data

US 2016/0297683 A1    Oct. 13, 2016

Related U.S. Application Data

(63) Continuation-in-part of application No. 14/713,005, filed on May 15, 2015, and a continuation-in-part of application No. 14/713,043, filed on May 15, 2015, now Pat. No. 9,783,885, said application No. 14/713,005 is a continuation-in-part of application No. 14/120,508, filed on May 28, 2014, now Pat. No.
(Continued)

(51) Int. Cl.
| | | |
|---|---|---|
| *B01J 19/12* | (2006.01) |
| *C01B 21/06* | (2006.01) |
| *C30B 29/04* | (2006.01) |
| *C01B 32/25* | (2017.01) |
| *C01B 32/28* | (2017.01) |
| *C01B 32/956* | (2017.01) |

(52) U.S. Cl.
CPC ......... *B01J 19/126* (2013.01); *C01B 21/0605* (2013.01); *C01B 32/25* (2017.08); *C01B 32/28* (2017.08); *C01B 32/956* (2017.08); *C30B 29/04* (2013.01)

(58) Field of Classification Search
None
See application file for complete search history.

(56) References Cited

U.S. PATENT DOCUMENTS

| | | |
|---|---|---|
| 618,703 A | 1/1899 | Maxim |
| 618,704 A | 1/1899 | Maxim |

(Continued)

FOREIGN PATENT DOCUMENTS

| | | |
|---|---|---|
| EP | 1 637 218 A2 | 3/2006 |
| JP | 2001148487 A | 5/2001 |

(Continued)

OTHER PUBLICATIONS

Stishov et al. (Structure and Superconductivity of Isotope-Enriched Boron-Doped Diamond (Year: 2009).*

(Continued)

*Primary Examiner* — Guinever S Gregorio
(74) *Attorney, Agent, or Firm* — William E. Beaumont; Juneau & Mitchell

(57) ABSTRACT

A combinatorial synthesis of a heterodiamond unit cell, which entails a step of reacting a tetrahedranoidal molecule with a heteroatom to form heterodiamond unit cell and then heterodiamond mass.

34 Claims, 9 Drawing Sheets

Related U.S. Application Data 9,061,917, said application No. 14/713,043 is a continuation-in-part of application No. 14/120,508, filed on May 28, 2014, now Pat. No. 9,061,917, which is a continuation-in-part of application No. 13/204,218, filed on Aug. 5, 2011, now Pat. No. 8,778,295.

(60) Provisional application No. 61/344,510, filed on Aug. 11, 2010.

(56) References Cited

U.S. PATENT DOCUMENTS

| | | | |
|---|---|---|---|
| 3,630,768 | A | 12/1971 | Bianchi et al. |
| 4,187,083 | A | 2/1980 | Wedlake et al. |
| 4,434,188 | A | 2/1984 | Kamo |
| 4,446,666 | A | 5/1984 | Gilman |
| 4,489,199 | A | 12/1984 | Wengrovius |
| 5,051,785 | A | 9/1991 | Beetz |
| 5,145,712 | A | 9/1992 | Jesser et al. |
| 5,180,571 | A | 1/1993 | Hosoya et al. |
| 5,201,986 | A | 4/1993 | Ota |
| 5,217,700 | A | 6/1993 | Kurihara |
| 5,256,913 | A | 10/1993 | Sommer |
| 5,270,077 | A | 12/1993 | Knemeyer |
| 5,270,987 | A | 12/1993 | Knemeyer |
| 5,284,709 | A | 2/1994 | Herb |
| 5,310,703 | A | 5/1994 | Visser et al. |
| 5,364,423 | A | 11/1994 | Bigelow |
| 5,470,661 | A | 11/1995 | Bailey |
| 5,474,808 | A | 11/1995 | Aslam |
| 5,507,987 | A | 4/1996 | Windischmann |
| 5,547,716 | A | 8/1996 | Thaler |
| 5,569,501 | A | 10/1996 | Bailey et al. |
| 5,849,079 | A | 12/1998 | Gruen |
| 5,871,805 | A | 2/1999 | Lemelson |
| 5,981,057 | A * | 11/1999 | Collins .................. C23C 16/274 407/119 |
| 6,060,118 | A | 5/2000 | Ishikura |
| 6,061,118 | A | 5/2000 | Ishikura |
| 6,319,439 | B1 | 11/2001 | Lee |
| 6,342,195 | B1 | 1/2002 | Roy et al. |
| 6,592,839 | B2 | 7/2003 | Gruen |
| 6,858,080 | B2 | 2/2005 | Linares |
| 7,037,370 | B2 | 5/2006 | Mearini |
| 7,132,309 | B2 | 11/2006 | Sung |
| 7,160,489 | B2 | 1/2007 | Didenko |
| 7,306,778 | B2 | 12/2007 | Chaffin |
| 7,368,013 | B2 | 5/2008 | Sung |
| 7,687,146 | B1 | 3/2010 | Freitas |
| RE41,189 | E | 4/2010 | Li |
| 7,833,505 | B2 | 11/2010 | Donnet et al. |
| 7,842,134 | B2 | 11/2010 | Whitehead |
| 7,867,467 | B2 | 1/2011 | Dolmatov |
| 7,938,992 | B2 | 5/2011 | Zhao |
| 7,938,997 | B2 | 5/2011 | Zhao et al. |
| 8,171,568 | B2 | 5/2012 | Freitas et al. |
| 8,276,211 | B1 | 9/2012 | Freitas et al. |
| 8,506,919 | B2 | 8/2013 | Saito |
| 8,506,920 | B2 | 8/2013 | Swanson |
| 8,728,429 | B2 | 5/2014 | Shenderova |
| 8,778,295 | B2 * | 7/2014 | Hodes .................. C01B 31/06 117/79 |
| 8,932,553 | B2 | 1/2015 | Curmi |
| 9,061,917 | B2 * | 6/2015 | Hodes |
| 9,099,375 | B2 | 8/2015 | Kub |
| 2003/0106488 | A1 | 6/2003 | Huang |
| 2003/0131787 | A1 * | 7/2003 | Linares .................. C30B 25/02 117/93 |
| 2004/0258918 | A1 | 12/2004 | Chaffin |
| 2005/0168122 | A1 | 8/2005 | Dahl et al. |
| 2010/0015438 | A1 * | 1/2010 | Williams .............. C23C 16/006 428/332 |
| 2011/0014112 | A1 | 1/2011 | Misra |
| 2011/0280790 | A1 | 11/2011 | Hemley |
| 2012/0040868 | A1 * | 2/2012 | Hodes .................. C01B 31/06 506/23 |
| 2014/0150713 | A1 | 6/2014 | Coe |
| 2014/0161710 | A1 | 6/2014 | Zousman |
| 2014/0234556 | A1 | 8/2014 | Dodge |
| 2014/0286851 | A1 | 9/2014 | Hodes |
| 2014/0335274 | A1 | 11/2014 | Vandenryt |
| 2015/0240381 | A1 | 8/2015 | Linares |
| 2015/0259790 | A1 | 9/2015 | Newman |
| 2016/0297683 | A1 | 10/2016 | Newman et al. |
| 2016/0297685 | A1 | 10/2016 | Newman et al. |

FOREIGN PATENT DOCUMENTS

| | | |
|---|---|---|
| WO | WO 88/02792 | 4/1988 |
| WO | WO 1988/02729 | 4/1988 |
| WO | WO 1988002792 A1 | 4/1988 |
| WO | WO 2015/176045 | 11/2015 |
| WO | PCT/US2017/00032 | 5/2017 |

OTHER PUBLICATIONS

Maier, et al., "Tert-butyl-Substituierte Cyclobutadiene Und Cyclopentadienone" Tetrahedron Letters No. 11, pp. 1025-1030, 1972.

Maier, et al., "Tetrakis(trimethylsilyl)tetrahedrane" J. Am. Chem. Soc. 2002 124, 13819-13826.

Maier, et al., "Tetra-tert-butyltetrahedrane" Angew. Chem. Int. E. Engl. 17 (1978) No. 7.

Maier, et al., "Tetrakis(trimethylsilyl)cyclobutadiene and Tetrakis (trimethylsilyl)tetrahedrane" Angew. Chem. Int. Ed. 2001 40, No. 9.

Eaton and Cole, "Cubane" J. Am. Chem. Soc. 86, 962-963 (1964).

Eaton and Cole, "Cubane" J. Am. Chem. Soc. 86, 3157-3158 (1964).

U.S. Appl. No. 13/204,218, filed Aug. 5, 2011. Status: Office Action dated Jun. 24, 2013. Issued as U.S. Pat. No. 8,778,295, on Jul. 15, 2014.

U.S. Appl. No. 14/120,508, filed May 28, 2014. Status: Office Action dated Dec. 16, 2014. Issued as U.S. Pat. No. 9,061,917, on Jun. 23, 2015.

PCT/US15/30963, filed on May 15, 2015. Status: International Search Report (ISR) and Written Opinion (WO)dated Aug. 7, 2015. Remains pending.

U.S. Appl. No. 14/713,005, filed May 15, 2015. Status: Office Action dated Sep. 8, 2015. Remains pending.

U.S. Appl. No. 14/713,043, filed May 15, 2015. Status: Office Action dated Nov. 23, 2015. Remains pending.

U.S. Appl. No. 14/934,679, filed Nov. 6, 2015. No Office Action received yet. Remains pending.

Maier, et al., "Tert-Butyl-Substituerte Cyclobutadiene Und Cyclopentadienone" Tetrahedron Letters No. 11, pp. 1025-1030, 1972.

Maier, et al., "Tetra-tert-butyl tetranedrane" Angew. Cnem. Int. E. Engl. 17 (1978) No. 7.

Maier, et al., "Tetrakis(trimetnylsilyl)cyclobutadiene and TetraKis (trimethylsilyl)tetrahedrane" Angew. Chem. Int. Ed. 2001 40 No. 9.

Popov, et al., "Deposition of BCN Films by Laser Ablation", Laser Physics, vol. 8, No. 1, 1998, pp. 280-284.

Goglio, et al., "Evidence for low-compressibility carbon nitride polymorph elaborated at ambient pressure and mild temperature" Diamond & Related Materials 18 (2009) 627-631.

Wikipedia, "Heterodiamond".

Goglio, et al., Evidence for Low-compressibility cabon nitride polymorph elaborated at ambient pressure and mild temperature Diamond & Related Materials 18 (2009) 627-631.

Heterodiamond, Wikipedia.

Raman; Proc. Indian Acad. Sci. A46; 391-398; 1957.

Worland; See the 'Perfect' Diamond That Sold for $22 Million at Sotheby's, Time Magazine 2015.

Wikipedia, https://en.wikipedia.org/wiki/Diamond_cubic.

U.S. Appl. No. 13/204,218, now U.S. Pat. No. 8,778,295.

U.S. Appl. No. 14/120,508; now U.S. Pat. No. 9,061,917.

U.S. Appl. No. 14/713,043, now allowed.

(56) References Cited

OTHER PUBLICATIONS

U.S. Appl. No. 14/934,679; pending.
Popov, "Deposition of BCN Films by Laser Ablation", Laser Physics—Lawrence 8; 1, 280-284 (1998).
Goglio, "Carbon Nitrides: A Promising Class of Materials", High Pressure Research, 2002, vol. 22, pp. 535-537.
Awschalom, "The Diamond Age of Spintronics", Scientific American, Oc. 2007, pp. 84-91.
Kumar, Nature ommunications, Formation of Nandiamonds at Near Ambient Conditions Via Microplasma Dissociation of Ethanol Vapor, 4 Article No. 2618. Oct. 21, 2013.
Wang, "Thermochemistry of Benzvalene, Dihydrobenzvalane and Cubane", L. Phys. Chem. B 1997, 101; 3400-3403 (Abstract).

\* cited by examiner

X = -CH=CH-, CO, or -N=N-

X = -CH=CH-, CO, or -N=N-

X = CO or -N=N-

METHODS OF PRODUCING HETERODIAMOND AND APPARATUS THEREFOR

FIELD OF THE INVENTION

The present invention relates to methods and apparatus for performing the combinatorial synthesis of the heterodiamond unit cell and a heterodiamond mass therefrom.

More particularly, it relates to methods and apparatus for controllably producing a heterodiamond molecule having the tetrahedral structure of the diamond unit cell with a heteroatom controllably, and with precise stoichiometry, substituted into the diamond unit cell thereby replacing a carbon atom.

BACKGROUND OF THE INVENTION

The term "heterodiamond" is conventionally defined to mean a super hard material containing boron, carbon and nitrogen (BCN). It is formed at high temperatures and high pressures, e.g., by application of an explosive shock wave to a mixture of diamond and cubic boron nitride." In contrast, the heterodiamond of the present invention is produced using combinatorial synthesis reactions at or around ambient pressure. Furthermore, the heterodiamond of the present invention, synthesized controllably and with precise stoichiometry, can be exclusively either aza-diamond or bora-diamond. This is the definition and meaning of the term "heterodiamond" as used in the present specification, which is not to be confused with the conventionally used term "heterodiamond," which is BCN as already noted.

In addition, the term "diamond molecule" has been incorrectly used for diamondoid molecules and masses of diamondoid molecules such as adamantine. In fact, adamantane is a hydrocarbon whose structure is unrelated to that of the diamond unit cell: the diamond molecule.

Zhao et al., in U.S. Pat. No. 7,938,997, disclose the preparation of a bulk superhard B—C—N nanocomposite compact. This is done by first ball-milling a mixture of graphite and hexagonal boron nitride, which is then encapsulated in a pressure range of 15 GPa to about 25 GPa and sintered at a temperature ranging from 1,800 to 2,500 K. These compacts include both boron and nitrogen. The heterodiamond of the present invention, however, is produced by a combinatorial synthesis reaction at generally ambient conditions. Furthermore, the present invention controllably yields either bora-diamond or aza-diamond individually with precise stoichiometries.

Popov et al. in their article "Deposition of BCN Films by Laser Ablation," describe the deposition of BCN films on silicon substrates by laser ablation. The films were deposited at 600° C. and 950° C. In contrast, the present invention produces aza-diamond and bora-diamond with precise stoichiometries under generally ambient conditions using a combinatorial synthesis of heterodiamond unit cells.

Goglio et al. disclose the decomposition of commercial thiosemicarbazide at 600° C. under nitrogen flow to produce carbon nitrides. This is different from the present invention wherein a carbon of the diamond unit cell is substituted with a heteroatom to produce a heterodiamond unit cell using a combinatorial synthesis.

In the published patent application, US 2015/0240381, Linares et al. disclose a boron doped single crystal diamond electrochemical synthesis electrode. They dope diamond with boron and thus do not controllably and precisely introduce a boron atom as a heteroatom that substitutes for a carbon atom in the diamond unit cell. This is different from the present invention, which produces heterodiamond wherein a heteroatom becomes an integral atom in the unit cell, occupying either an apical position or center, "cage," position of the unit cell.

The diamond unit cell is the smallest assembly of carbon atoms that make up diamond. It is, essentially, the diamond molecule. The diamond unit cell is a tetrahedral structure comprising five carbon atoms with a carbon atom at each of the four apices and one in the center, "cage" position. Each carbon atom is bonded to each other carbon atom of the diamond unit cell. The bonds in diamond are short, strong sp3 bonds, which render the three-dimensional, solid structure of diamond, as opposed to graphite, another allotrope of carbon, which has sp2 bonds and is planar. The preparation of the diamond unit cell, whose structure is shown below, is described in U.S. Pat. Nos. 8,778,295 and 9,061,917:

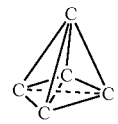

The diamond unit cell

Conventional ways of fabricating diamond generally rely on the use of high pressure/high temperature or chemical vapor deposition methods. Diamond produced conventionally has several disadvantages including the following three. First, the high temperature processing of conventional methods precludes the use of many deposition substrates. Second, lengthy processing times make conventional diamond production uneconomical for many potential applications. Third, impurities produced by conventional methods require additional, expensive purification steps before the diamond product can be used in high precision applications such as semiconductor electronics and optics.

As a material, diamond has many desirable properties that make it ideal for microelectronic, optics, and other technological applications. These include extreme hardness, high index of refraction, high dielectric constant, extremely broad transparency bandwidth, band gap energy of around 5.45 ev, and others. Additionally, while diamond is an excellent electrical insulator, it is also one of the best heat conductors, more than four times better than copper. Unfortunately, because of their disadvantages, conventional methods of producing diamond have not been able to exploit these properties sufficiently to meet the large potential industrial demand that diamond, as a technological material, deserves. Furthermore, no method and apparatus to date has been able to produce reliably and controllably an identifiable diamond unit cell wherein a carbon atom is substituted by a heteroatom to produce "heterodiamond" as defined herein.

A diamond p-type semiconductor can be produced by doping diamond with boron. For example, when diamond is produced by conventional chemical deposition methods, boron is introduced into the gas stream of the reactor to form a boron impurity (i.e., dopant) that is incorporated into the diamond. This boron, however, is not controllably substituted for a carbon of the diamond unit cell, thus controllably and predictably yielding a heterodiamond unit cell. Rather, as an impurity, it is essentially a useful defect in the diamond crystal lattice.

It is also known that nitrogen can be contained within CVD-produced diamond. Indeed, nitrogen vacancies in diamond are currently an active area of research because they have the potential to yield a spintronic material that can be used as quantum electronic devices with qubits and quantum logic gates. This work is described in an article titled "The Diamond Age of Spintronics" (David D. Awschalom, et al., Scientific American, October, 2007, pp. 84-91.) The nitrogen of nitrogen vacancies in diamond and nitrogen-doped diamond, however, do not reliably and controllably substitute for a carbon atom of the diamond unit cell to yield a heterodiamond unit cell.

The term "heterodiamond" has been used conventionally, albeit incorrectly, for a very hard material containing boron, carbon and nitrogen (BCN) usually formed by applying a shock wave to a mixture of diamond and cubic boron nitride. Another variety is cubic $BC_2N$, which is produced at very high pressures from a graphite-like $BC_2N$. Thus, heterodiamond has been used conventionally to describe a ceramic material, which is not structurally related to diamond. These ceramic materials do not reliably, controllably, and consistently comprise a diamond unit cell that has been modified to include a heteroatom such as boron or nitrogen substituting for a carbon atom of the diamond unit cell to produce a heterodiamond unit cell. In contrast the present invention is directed to a diamond unit cell having a carbon replaced by a single heteroatom such as nitrogen or boron resulting in a heterodiamond unit cell. Thus, for the purposes of this specification, the term "heterodiamond" is used to mean a material comprising at least one diamond unit cell wherein a heteroatom, such as nitrogen or boron, replaces a carbon atom: the heterodiamond unit cell. For the purposed of the present invention, the homo-penta-atomic molecule having five carbon atoms in a tetrahedral configuration with one carbon atom occupying the center "cage" position and four carbon atoms deployed apically, is designated the "homo-diamond unit cell."

It is important to distinguish between the use of boron and nitrogen as diamond dopants and the use of those elements in the present invention wherein nitrogen and boron are incorporated as structural members of the diamond unit cell. When nitrogen, boron, or other elements are used as diamond dopants, they are infiltrated into the lattice of the diamond mass. They are not chemically a part of the structure of the diamond unit cell in that they are not bonded to the carbon atoms that comprise the diamond unit cell. They are, rather, intervening impurities that become defects in the diamond crystal lattice that render the diamond a semiconductor. In contrast to doped diamond, the heteroatoms of the present invention are structurally a part of the crystal lattice because they are structural elements of the heterodiamond unit cells and of the heterodiamond mass which they comprise.

A heteroatom can occupy one of two positions of the heterodiamond unit cell, the center "cage" position or an apex position of the tetrahedron. A geometric analysis can be performed relating to atoms with sizes that are close to that of carbon. In the periodic chart, carbon is flanked by the III, V elements boron and nitrogen, respectively. Carbon has an atomic radius of 70 pm, while boron and nitrogen have atomic radii of 85 pm and 65 pm, respectively. The covalent radii of carbon, boron and nitrogen, are 77 pm, 83 pm, and 75 pm, respectively. Thus, the practitioner will recognize that nitrogen is small enough to occupy the center "cage" position of the diamond unit cell. The atomic radius and covalent radius of boron are such that it can occupy an apical position of the heterodiamond unit cell.

Thus, the skilled practitioner might recognize that boron or nitrogen as a substitute element for carbon in a diamond unit cell is possible if a mechanism for their incorporation could be implemented. Heterodiamond unit cells, which are the subject of the present invention, include aza-diamond, in which the heteroatom is nitrogen, and bora-diamond, in which the heteroatom is boron. These are shown below:

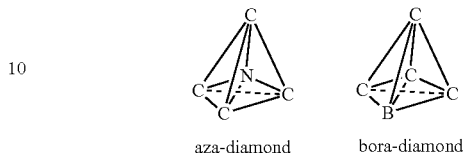

aza-diamond    bora-diamond

The skilled practitioner will also recognize that aza-diamond and bora-diamond, once formed, are charged monopoles, that is, species bearing charge with no counter charge.

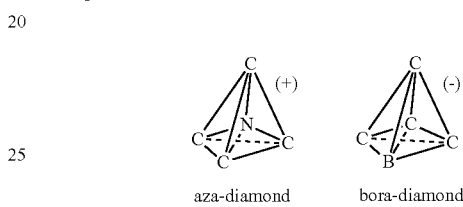

aza-diamond    bora-diamond

However, to date, neither of the above compounds have been formed, let alone used to form masses of aza-diamond and bora-diamond.

SUMMARY OF THE INVENTION

Accordingly, it is an object of the present invention to substitute a heteroatom for a carbon atom in the diamond unit cell thereby producing a heterodiamond unit cell.

It is a further object of the present invention to produce a diamond unit cell that includes a non-carbon atom structurally incorporated into the unit cell, thus producing the heterodiamond unit cell.

It is yet another object of the present invention to produce a plurality of heterodiamond unit cells.

Still another object of the invention is producing a heterodiamond unit cell by a vapor phase reaction.

Another object of the invention is to produce a heterodiamond unit cell by a solid state reaction.

A further object of the present invention is to produce a mixture comprising both homodiamond unit cells and heterodiamond unit cells.

Yet a further object of the present invention is an apparatus that can produce homodiamond unit cells, heterodiamond unit cells, and any combinations thereof.

The above objects and others can be accomplished by methods and apparatus previously disclosed for forming the diamond unit cell (homodiamond unit cell), which methods and apparatus are modified to react a heteroatom with a tetrahedranoidal molecule.

DETAILED DESCRIPTION OF THE PREFERRED EMBODIMENTS

Term Definitions

Field measurements: as used herein means measurements of experimental variables, such as temperature, pressure, reactant flow rates and nozzle sizes, for example, that may be adjusted with routine skill in the art to achieve best results.

Tetrahedranoidal molecules: as used herein means benzvalene, 3,4-diazabenzvalene and 2,3,4-methynyl-cyclobutanone. One or more of these molecules may be preferred in the reactions as described hereinbelow.

Figure 1A:
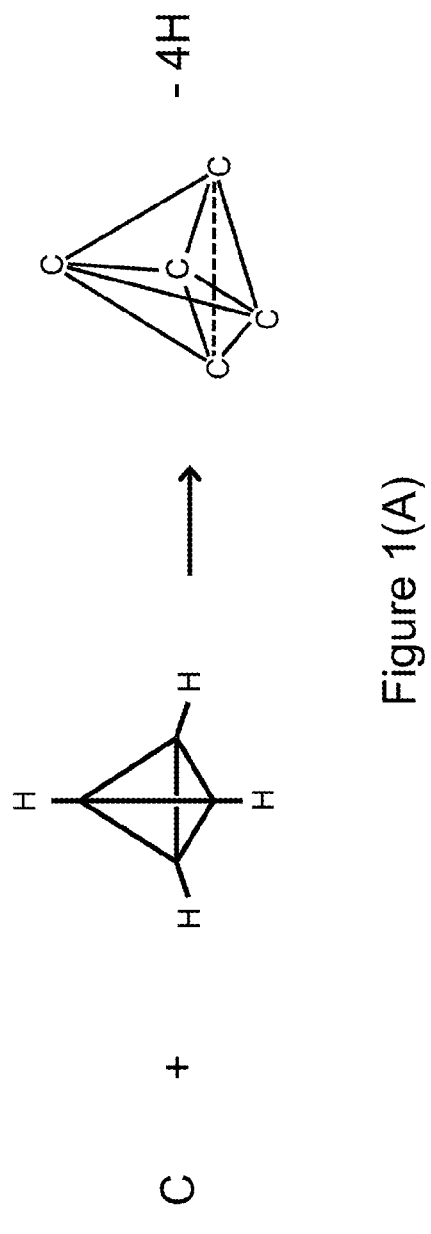
FIG. 1(A)-(B): (A) shows a vapor phase reaction for producing homodiamond using tetrahedrane as the tetrahedranoidal reactant. (B) shows a vapor phase reaction that produces homodiamond using three other tetrahedranoidal reactants.
Figure 1B:
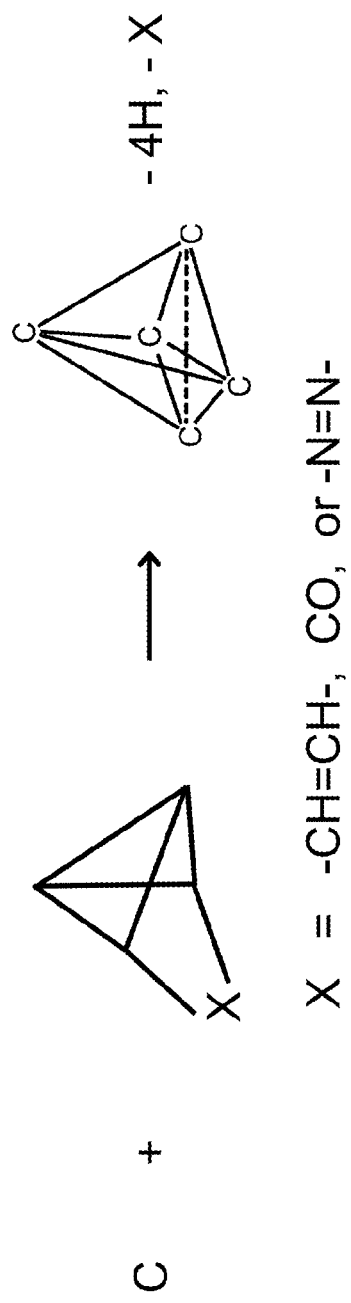

Combinatorial syntheses of the diamond unit cell are disclosed in U.S. Pat. Nos. 8,778,295 and 9,061,917, which are fully incorporated herein by reference in their entirety. These syntheses proceed by the reaction of an excited state carbon atom with a tetrahedranoidal molecule with concomitant ejection of leaving groups to form the diamond unit cell. The diamond unit cell produced by these combinatorial reactions is a homo-penta-atomic molecule being comprised of 5 carbon atoms. While not intending to be bound by theory, it is believed that the excited state carbon atom "inserts" into the unit cell cage position. FIGS. 1(A) and 1(B) illustrate the diamond unit cell forming reactions of the above cited references.

As disclosed in U.S. Pat. Nos. 8,778,295 and 9,061,917, the conditions under which the diamond unit cell, and consequently a diamond mass containing these unit cells, form are mild and altogether different from conventional diamond forming methods such as high pressure, high temperature (HPHT) and chemical vapor deposition. The disclosure of US 2015/0259213 is directed to means of exploiting the combinatorial syntheses of the diamond unit cell to produce diamond masses comprising diamond unit cells and articles comprised of such diamond masses that have been previously unavailable by conventional diamond forming methods due to the strenuous conditions of these conventional methods. US 2015/0259213 is also fully incorporated herein by reference in the entirety.

Insertion of an excited state heteroatom into a tetrahedranoidal molecule can be accomplished by adapting the methods of diamond unit cell synthesis described in the above cited references by substituting a heteroatom for a carbon atom in the diamond unit cell. There are two requirements for the hetero-atom to be substituted for carbon. First, the atomic radius of the hetero-atom must be similar to that of carbon. Second, the heteroatom must be capable of forming four sigma bonds (bond order of 4). Both nitrogen and boron and nitrogen have such capability. The atomic radius of carbon is 70 picometers (pm). The nitrogen atom has a radius of 65 pm, and the boron atom has a radius of 85 pm. When the heteroatom is nitrogen, the heterodiamond unit cell so produced is aza-diamond. When the heteroatom is boron, the heterodiamond unit cell so produced is bora-diamond. Both are hetero-penta-atomic molecules having the tetrahedron structure of diamond. The heterodiamond unit cells as discussed are charge monopoles in that they bear a charge without a species bearing a charge of opposite sign. The aza-diamond unit cell bears a positive charge because nitrogen must donate its lone pair of electrons to form the fourth sigma bond to a carbon atom of the tetrahedranoidal molecule. The bora-diamond unit cell bears a negative charge because the vacant orbital of the boron atom receives electron density from a carbon atom of the tetrahedranoidal molecule to form the fourth sigma bond between carbon and boron. Quaternary ammonium compounds of nitrogen such as tetramethyl ammonium salts are well known to organic chemists. Quaternary boride anions such as the tetraphenyl boride anion are also well known to organic chemists. Unipolar molecules have been well studied.

Vapor Phase Aza-Diamond

Figure 2:
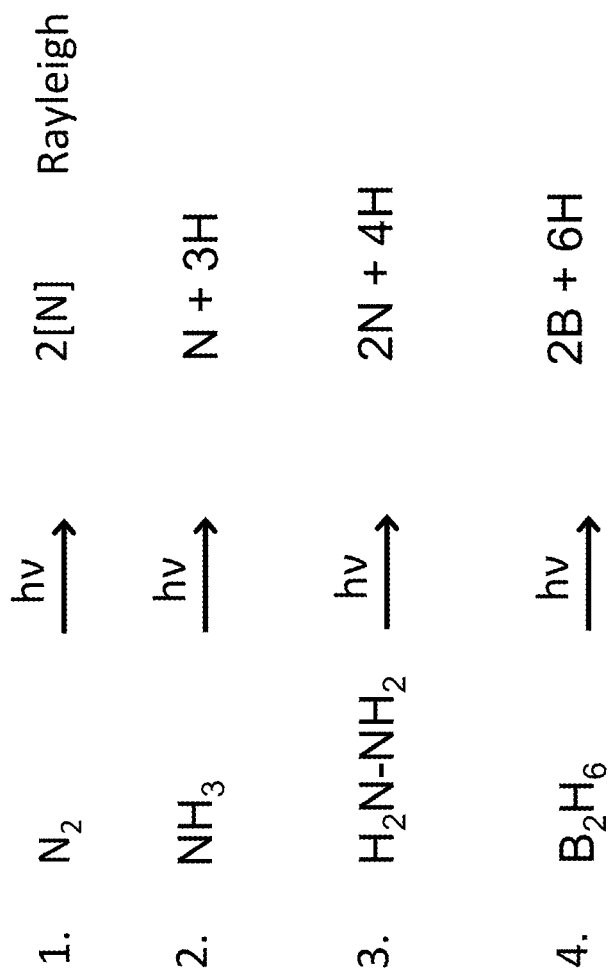
FIG. 2 shows three reactions for producing excited state atomic nitrogen and one reaction for producing excited state atomic boron.

The vapor phase reactions for the production of the homodiamond unit cell and the aza-diamond unit cell are substantially the same as those of U.S. Pat. No. 9,061,917 (fully incorporated herein by reference), which details temperatures, pressures, and other reaction conditions for effecting the synthesis of homodiamond. However, in aza-diamond unit cell synthesis, cubane is replaced by a source of excited state nitrogen atoms. With reference to FIG. 2, reactions 1-3, three nitrogen atom sources may be used: dinitrogen, ammonia, and hydrazine, respectively. The microwave discharge used for obtaining excited state carbon atoms from vapor phase cubane may be used to obtain excited state nitrogen atoms from ammonia and hydrazine. To derive atomic nitrogen from dinitrogen gas, a high voltage discharge is used (Rayleigh). The same method may also be used with ammonia and hydrazine (reactions 2 and 3). All these sources must be delivered to the system as a vapor in an inert carrier gas (He, Ar, Ne, Kr, Xe). Care must be taken to ensure that the nitrogen atoms so produced are delivered to the reaction zone in such a manner that their reaction with the tetrahedranoidal molecule does occur because nitrogen atoms recombine to dinitrogen at an extremely high rate. Thus, the dispensing nozzle must be located within the "cloud" of vaporous tetrahedanoidal compound. The kinetically and thermodynamically favored recombination of nitrogen atoms to form dinitrogen is also advantageous because excess atomic nitrogen will recombine rather than deposit into the diamond mass so produced. The stoichiometric considerations required for the heterodiamond unit cell forming reaction are exactly opposite of those for the homodiamond unit cell forming reaction. For the heterodiamond unit cell reaction, an excess of the excited state atom to be cage inserted relative to the tehrahedranoidal reactant is required. In the homodiamond unit cell reaction, an excess of the tetrahedranoidal compound relative to the excited state carbon atom is required.

The reactions for forming the aza-diamond unit cell are shown in FIG. 3. The excited state nitrogen atoms in inert carrier gas are delivered by a nozzle disposed within the volume of the vaporous tetrahedranoidal molecule "cloud," and this nozzle is also the high energy discharge apparatus that is a conduit comprising an electrical insulator within which are a discharge electrode pair. Such an apparatus, into which are disposed the discharge electrodes (these can be metal foils such as Cu, Pt, Pd, Au, etc.), may comprise diamond prepared by the diamond unit cell forming methods disclosed by Newman et al. in US 2015/0259790. The nozzle material may also comprise glass or ceramic, but diamond by the unit cell process is preferred owing to its electrical insulating properties unavailable by diamond produced by conventional processes.

Nitrogen atom flow rates, dispensing nozzle dimensions and geometry are best determined by field measurements for preferred results and control by appropriate hardware and software. The same is done when the tetrahedranoidal molecule reactant is used.

Pressures and temperatures of the vapor phase reaction for forming the aza-diamond unit cell are preferentially maintained to deter the rearrangement or decomposition of the tetrahedranoidal molecule. Benzvalene is vaporized between 77 and 80° C. at 760 mm pressure at a rate of not more than 5° C. per minute. Reduced pressure may be used for benzvalene vaporization with concomitant decrease in vaporization temperature, but the rate of heating should not be altered from that which is used for atmospheric vaporization of benzvalene. Reduced pressure reaction conditions using benzvalene are preferably determined by field measurements. Tetrahedranone may be used as the tetrahedranoidal reactant, but it should only be vaporized at atmospheric pressure and at about 37° C. to avoid autogenous ejection of CO which leads to decomposition of tetrahedranone.

Externally applied heating to the reaction zone provides no advantage with respect to driving the reaction of the tetrahedranoidal molecule and an excited state nitrogen atom. In fact, heat other than that used to vaporize the nitrogen atom source and the tetrahedranoidal molecule should not be applied to the reaction zone.

Solid State Aza-Diamond

As disclosed in U.S. Pat. No. 9,061,917, the solid state homodiamond unit cell forming reaction proceeds by forming a homogeneous blend of benzvalene and cubane in an 8:1 benzvalene:cubane ratio having high stoichiometric precision to prevent the formation of carbonaceous impurities in the mass of diamond unit cells so produced due to an excess (or deficiency) of either cubane or benzvalene. Care must be taken during preparative manipulations of the homogeneous blend of reactants such that this precise stoichiometric ratio is not altered by the vapor pressures of the two blend constituents. Accordingly, the preparative manipulations and the actual reaction by exposure to a high energy discharge are conducted at temperatures that substantially prevent mass loss due to vapor pressures of the blend constituents. Similar precautions must be exercised for solid state heterodiamond unit cell forming reactions. Hydrazine is the most convenient source of reactive nitrogen atoms. Ultrapure and military propellant grade hydrazine is available commercially eliminating the need to remove water from the mono-hydrate or neutralize HCl associated with the mono-hydrochloride. Literature methods for obtaining pure hydrazine from the hydrate or the hydrochloride may be also used by the skilled practitioner. Hydrazine freezes at 2.0° C., boils at 113.5° C., and has a vapor pressure of 10 mm at 30.7° C. Following the procedures of U.S. Pat. No. 9,061,917, stock solutions of benzvalene and hydrazine (substituted for cubane) in a solvent such as diethyl ether are prepared having a high degree of stoichiometric precision with respect to molar concentration. These solutions are combined in a ratio of 2:1 benzvalene to hydrazine, and the solution so obtained is freed of solvent under reduced pressure and temperature to produce the homogeneous solid reaction blend for exposure to a microwave discharge under an inert atmosphere with appropriate cooling to eliminate mass losses due vapor pressure of the blend components. Despite the fact that nitrogen atoms readily recombine to form dinitrogen gas, it is not recommended that the stoichiometric precision prescription be relaxed in a favor of a slight excess of nitrogen atom source for the sake of manipulative convenience as this may lead to the possibility of impurity formation.

A charge of opposite sign to that of the aza-diamond unit cell may be impressed upon the reaction vessel to mitigate like charge repulsions between the aza-diamond unit cells formed. However, the effect of a static electric field upon benzvalene has not been studied, to date. Accordingly, the reaction should be conducted in a sealed tube type of apparatus.

Regardless of whether the vapor phase or solid state reaction is used to form aza-diamond unit cell and/or diamond mass, neither reaction uses a diamond seed or heterodiamond seed, and neither the aza-diamond unit cell nor diamond mass contain any boron nitride.

Bora-Diamond

The boron atomic radius is 85 pm and thus is unlikely to occupy the cage position of the diamond unit cell. Furthermore, anions are well known by both chemists and physicists to have radii larger than their neutral atom counterparts owing to the presence of excess electrons constituting the "noble gas shell." Accordingly, a synthetic strategy for inserting a boron atom into the cage position of a tetrahedranoidal molecule should not be used. A different strategy is required because a different kind of heterodiamond unit cell is produced relative to the homodiamond unit cell or the aza-diamond unit cell.

The bora-diamond unit cell must be prepared using an apical insertion strategy. This is unlikely to proceed using the method of U.S. Pat. No. 9,061,917 using benzvalene. Referring to U.S. Pat. No. 9,061,917, two other tetrahedronoidal reactants are disclosed: 3,4-diazabenzvalene and 2,3,4-methynyl-cyclobutanone ("tetrahedranone"). While their tetrahedronoidal structures are closely related to that of benzvalene structure, their stability is different. Both tetrahedranone and diazabenzvalene can decompose autogenously if care is not taken in storage and manipulations.

Benzvalene does not decompose in the strict sense; rather, it re-arranges to benzene, which can be removed from benzvalene under reduced pressure. The other two tetrahedranoidal molecules decompose because their "leaving groups," or ejection products, are thermodynamically stable species (dinitrogen for 3,4-diazabenzvalene; carbon monoxide (C≡O) for tetrahedranone). The decomposition product of both of these tetrahedanoidal molecules is a transient di-radical.

This extremely unstable structure produces dicyclobutadiene, which presumably results from the initial decomposition product, cyclobutadiene, an extremely unstable species. The formation of cyclobutadiene requires an intramolecular re-arrangement. The synthesis of the bora-diamond unit cell exploits this decomposition and intramolecular re-arrangement in that it "traps" the unstable initial product formed by ejection product release and provides a thermodynamically more stable re-arrangement product than cyclobutadiene. This produces the bora-diamond unit cell by incorporating the boron atom apically. The preferred tetrahedranoidal molecule for this reaction is 2,3,4-methynyl-cyclobutanone because its counterpart, 3,4-diazabenzvalene, is only stable below −60° C.

To exploit the decomposition of tetrahedranone and trap its decomposition product by a boron atom, it is crucial to exercise control over this decomposition, and this places limits upon the conditions of this reaction. Tetrahedranone cannot be allowed to decompose autogenously; rather, this decomposition must be a result of the chemical interaction between tetrahedranone and an excited state boron atom. It is highly unlikely that an excited state boron atom will be able to react with an autogenous tetrahedranone decomposition transient. Thus, the conditions of the reaction must preserve the integrity of tetrahedranone in the vapor phase. This requires very gentle heating to no more than about 40° C., and this heating must not be rapid. Autogenous decomposition of tetrahedranone occurs by loss (ejection) of CO, which is a very stable leaving group. Thus, to deter ejection of CO, reduced pressures cannot be tolerated. It is recommended that the reaction be conducted at not less than 1 atmosphere and not more than two atmospheres. Reduced pressure favors the loss of CO. Excessive overpressure hinders the vaporization of tetrahedranone. Accordingly, bora-diamond must be prepared in the vapor phase following the procedures for vapor phase homodiamond unit cell synthesis of U.S. Pat. No. 9,061,917 using tetrahedranone as the tetrahedranoidal compound and substituting diborane for cubane but maintaining temperature and pressure of the reaction within the narrow ranges detailed above to deter autogenous decomposition of tetrahedranone in favor of (excited state) boron atom interaction with tetrahedranone to form bora-diamond.

Bora-diamond should preferably be formed by the reaction of tetrahedranone and an excited state boron atom. Accordingly, heat other than that used to vaporize the atomic boron source and tetrahedranone should not be applied to the reaction zone. Tetrahedranone is best vaporized at atmospheric pressure and at its vaporization temperature which is approximately 37° C. Higher temperatures are counter-indicated because tetrahedranone decomposes thermally. Pressures higher than one atmosphere would require a higher vaporization temperature for tetrahedranone which is likely to lead to autogenous and thermally induced decomposition of tetrahedranone. Reduced pressure can be used to reduce the heat required to vaporize tetrahedranone, but this increases the likelihood of ejection of CO and concomitant decomposition of tetrahedranone. Thus, the proper use of reduced pressure to vaporize tetrahedranone to form the bora-diamond unit cell by the reaction of an excited state boron atom with vaporous tetrahedranone is preferably set by field measurements.

With reference to FIG. 2, reaction 4, the boron atom source may be diborane. The microwave discharge used for obtaining excited state carbon atoms from vapor phase cubane may be used to obtain excited state boron atoms from diborane.

Reactions for forming the bora-diamond unit cell are shown in FIG. 4. The boron source must be delivered to the system as a vapor in an inert carrier gas such as argon, helium, etc. Care must be taken to ensure that the boron atoms so produced are delivered to the reaction zone. Thus, the dispensing nozzle must be located within the "cloud" of vaporous tetrahedanoidal compound. The stoichiometric considerations required for the heterodiamond unit cell forming reaction using boron as the heteroatom are the same as those for the homodiamond unit cell forming reaction. An excess of tetrahedranoidal molecules relative to the excited state boron atoms is necessary to insure that all boron atoms delivered to the reaction zone are consumed by their reaction with the tetrahedranoidal molecules so that contamination of the heterodiamond deposited upon the deposition substrate by unreacted boron atoms does not occur.

The excited state boron atoms in inert carrier gas are delivered by a nozzle disposed within the volume of the tetrahedranoidal molecule vapor.

Boron atom flow rates, dispensing nozzle dimensions and geometry are determined by field measurements for optimization and control by appropriate hardware and software The same optimizations are done for the tetrahedranoidal molecule reactant to be used within the temperature and pressure ranges detailed above.

The synthesis of the bora-diamond unit cell is limited to the vapor phase reaction. Synthetic chemists are well aware of the behavior of boron hydrides with carbonyl compounds. In synthetic organic chemistry, boranes are reducing agents for aldehydes and ketones. Hence, a blend of diborane and tetrahedranone prepared at even very low temperatures will not serve as a solid state precursor for preparing the bora-diamond unit cell. Accordingly, bora-diamond must be prepared in the vapor phase following the procedures for vapor phase diamond unit cell synthesis of U.S. Pat. No. 9,061,917 substituting tetrahedranone for the tetrahedranoidal compound and diborane for cubane.

The vapor phase synthesis of bora-diamond uses neither diamond nor heterodiamond seed, nor does the produced bora-diamond unit cell and/or diamond mass contain any boron nitride.

Apparatus for Producing Homodiamond Unit Cells and Heterodiamond Unit Cells

Figure 6:
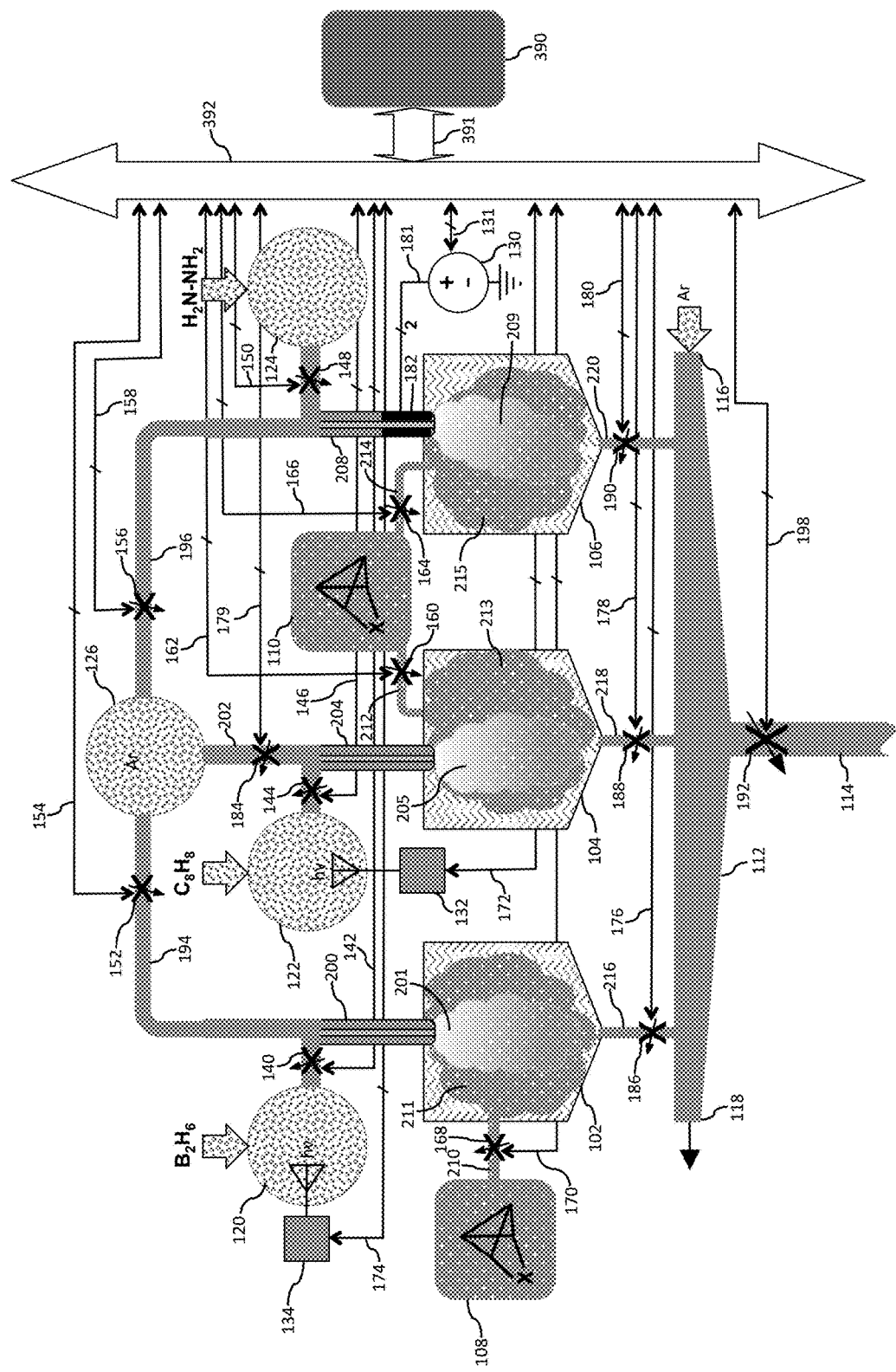
FIG. 6 is a schematic diagram of an integrated, controlled system for producing heterodiamond and homodiamond unit cells and a mixture of any combination thereof.

FIG. 6 shows an apparatus configured to produce homodiamond unit cells and heterodiamond unit cells. For the purposes of the present invention, the term "line" can mean one line or a plurality of lines. Reaction chambers 102, 104, and 106 are for producing bora-diamond, homodiamond, and aza-diamond, respectively. Thus, reaction chambers 102 and 106 are for producing heterodiamond unit cells and reaction is for producing homodiamond unit cells. There is one input port for the atomic reactant (i.e., B, C, N) and another for the tetrahedranoidal compound reactant. Tetrahedranoidal reactant conduits 210, 212, and 214 define tetrahedranoidal reactant input ports into reaction chambers 102, 104, and 106, respectively.

Reaction chambers 102, 104, and 106 receive boron, carbon, and nitrogen through conduit nozzles 200, 204, and 208, respectively, which define atomic reactant input ports. Inert gas source 126 provides, for example, argon as a carrier gas to the reaction chambers 102, 104, and 106 through carrier gas conduits 194, 202, and 196, respectively. Another inert gas (excluding nitrogen) such as helium can be used. The inert gas is also provided to boron source container 120, carbon source container 122 and nitrogen source container 124. Details (e.g., conduits and flow control, etc.) for providing the inert gas to the source containers are not shown in FIG. 6.

Diborane is subjected to a high energy discharge (e.g., microwave discharge) within the boron source container 120 to produce excited state boron atoms. This is reaction 4 of FIG. 2. As shown, a microwave discharge is provided by microwave source 134, within boron source container 120. Microwave source 134 is controlled by control line 174, which connects through to the systems controller 390 via the main system bus 392 and controller bus 391. The excited state boron atoms exit the boron source container 120 through boron flow control valve 140. Boron flow control valve 140 is controlled by system controller 390 via valve control line 142, which connects to system controller 390 through main system bus 392 and controller bus 391. Additional inert gas (as shown, argon) flows from inert gas source 126 through carrier gas conduit 194 controlled by carrier gas valve 152 and converges and mixes with the excited state boron atom stream controllably flowing through boron flow control valve 140. Inert gas valve 152 is controlled by control line 154, which connects to system controller 390 through main system bus 392 and controller bus 391. The excited state boron atom and argon mixture flow through conduit nozzle 200, which serves as an input port into reaction chamber 102. Tetrahedranoidal molecule source container 108 provides tetrahedranoidal molecules to reaction chamber 102 through tetrahedranoidal reactant conduit 210, which flow is controlled by valve 168. Valve 168 is controlled by control line 170, which is connected to system controller 390 through main system bus 392 and controller bus 391. For the synthesis of the bora-diamond unit cell, the preferred tetrahedranoidal molecule is 2,3,4-methynyl-cyclobutanone ("tetrahedranone").

Figure 4A:
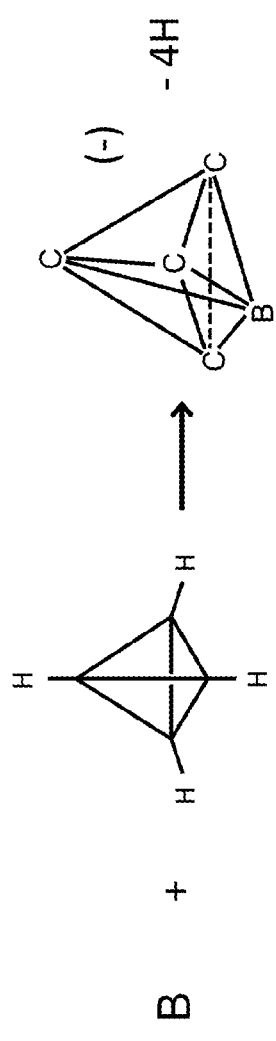
FIG. 4(A)-(B): (A) shows a vapor phase reaction for producing bora-diamond using tetrahedrane as the tetrahedranoidal reactant. (B) shows a vapor phase reaction that produces bora-diamond using two other tetrahedranoidal reactants.
Figure 4B:
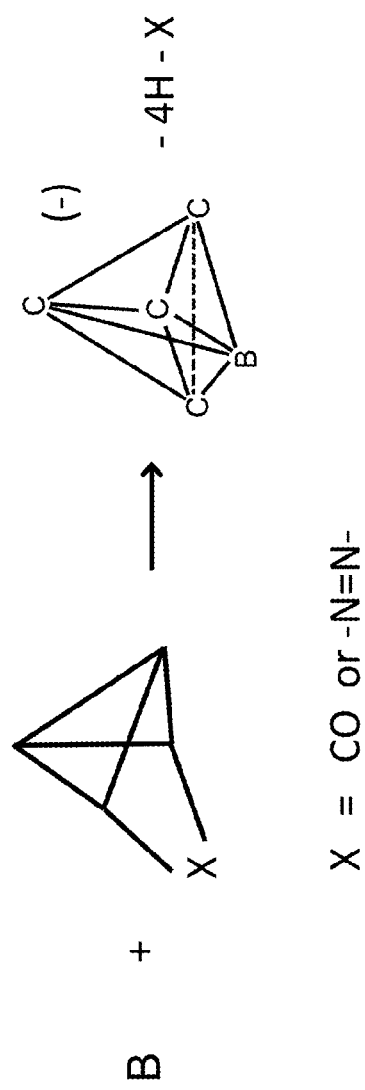

The bora-diamond unit cell reaction of FIG. 4(B) occurs in reaction chamber 102. Within reaction chamber 102, excited state boron atom cloud 201 is shown mixing and reacting with tetrahedranone vapor 211. The resulting bora-diamond unit cells are conducted out of reaction chamber 102 through bora-diamond output conduit 216. The output flow of the bora-diamond unit cells through bora-diamond output conduit 216 is controlled by bora-diamond output valve 186, which is regulated by the systems controller 390 via control line 176, which connects to the systems controller 390 through main system bus 392 and controller bus 391. Bora-diamond unit cells are provided through bora-diamond output conduit 216 to manifold 112.

The apparatus of FIG. 6 is also configured to produce homodiamond unit cells. This is achieved with the reaction shown in FIG. 1(B). Cubane is subjected to a high energy discharge (e.g., microwave discharge) within the carbon source container 122 to produce excited state carbon atoms. This reaction is disclosed in U.S. Pat. No. 9,061,917, which is incorporated fully herein by reference. As shown, a microwave discharge is provided by microwave source 132, within carbon source container 122. Microwave source 132 is controlled by control line 172, which connects through to the systems controller 390 via the main system bus 392 and controller bus 391. The excited state carbon atoms exit the carbon source container 122 through carbon flow control valve 144. Carbon flow control valve 144 is controlled by system controller 390 via valve control line 146, which connects to system controller 390 through main system bus 392 and controller bus 391. Additional inert gas (as shown, argon) flows from inert gas source 126 through carrier gas conduit 202, controlled by carrier gas valve 184 and converges and mixes with the excited state carbon atom stream controllably flowing through carbon flow control valve 144. Carrier gas valve 184 is controlled by control line 179, which connects to system controller 390 through main system bus 392 and controller bus 391. The excited state carbon atom and argon mixture flow through conduit nozzle 204, which serves as an input port into reaction chamber 104. Tetrahedranoidal molecule source container 110 provides tetrahedranoidal molecules to reaction chamber 104 through tetrahedranoidal reactant conduit 212, which flow is controlled by valve 160.

Valve 160 is controlled by control line 162, which is connected to system controller 390 through main system bus 392 and controller bus 391. For the synthesis of the homodiamond unit cell, the preferred tetrahedranoidal molecule is benzvalene.

The homodiamond unit cell reaction of FIG. 1(B) occurs in reaction chamber 104. Within reaction chamber 104, excited state carbon atom cloud 205 is shown mixing and reacting with benzvalene vapor 213. The resulting homodiamond unit cells are conducted out of reaction chamber 104 through homodiamond output conduit 218. The output flow of the homodiamond unit cells through homodiamond output conduit 218 is controlled by homodiamond output valve 188, which is regulated by the systems controller 390 via control line 178, which connects to the systems controller 390 through main system bus 392 and controller bus 391. Homodiamond unit cells are provided through homodiamond output conduit 218 to manifold 112.

The apparatus of FIG. 6 is also configured to produce aza-diamond unit cells. This is achieved with the reaction shown in FIG. 3(B). A nitrogen source is subjected to a high energy discharge (e.g., electrostatic discharge) to produce excited state nitrogen atoms. The FIG. 2 reactions 1, 2, or 3, which produce atomic nitrogen from molecular nitrogen, ammonia, and hydrazine, respectively, can be used to yield the excited state nitrogen atoms for synthesizing aza-diamond.

As shown in FIG. 6, hydrazine is used as a nitrogen atom source. Hydrazine exits nitrogen source container 124 through nitrogen flow control valve 148. Nitrogen flow control valve 148 is controlled by system controller 390 via valve control line 150, which connects to system controller 390 through main system bus 392 and controller bus 391. Additional inert carrier gas (as shown, argon) flows from inert carrier gas source 126 through carrier gas conduit 196 controlled by carrier gas valve 156 and converges and mixes with the excited hydrazine stream controllably flowing through nitrogen flow control valve 148. Inert gas valve 156 is controlled by control line 158, which connects to system controller 390 through main system bus 392 and controller bus 391.

The hydrazine mixed with the argon carrier gas mixture passes between electrostatic discharge electrode pair 182, which are powered by high voltage source 130 through power lines 181, of which there are two (i.e., on line per electrode). High voltage source 130 is controlled by systems controller 390 through control line 131, which connects through to systems controller 390 via main system bus 392 and controller bus 391. The electrodes of the discharge electrode pair 182, are located within conduit nozzle 208 and, when energized by voltage source 130, produce an electrostatic discharge between them. This electrostatic discharge causes hydrazine within conduit nozzle 208 to dissociate according to reaction 3 of FIG. 2, thereby producing excited state nitrogen atoms, which flow into reaction chamber 106.

Tetrahedranoidal molecule source container 110 provides tetrahedranoidal molecules to reaction chamber 106 through tetrahedranoidal reactant conduit 214, which flow is controlled by valve 164. Valve 164 is controlled by control line 166, which is connected to system controller 390 through main system bus 392 and controller bus 391. For the synthesis of the aza-diamond unit cell, the preferred tetrahedranoidal molecule is benzvalene.

Figure 3A:
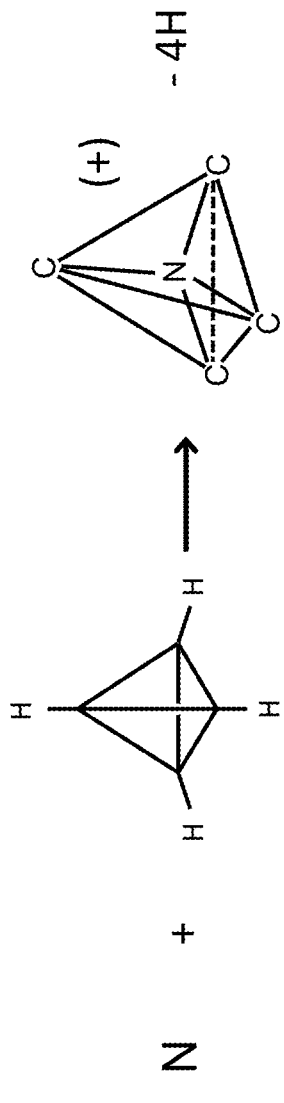
FIG. 3(A)-(B): (A) shows a vapor phase reaction for producing aza-diamond using tetrahedrane as the tetrahedranoidal reactant. (B) shows a vapor phase reaction that produces aza-diamond using three other tetrahedranoidal reactants.
Figure 3B:
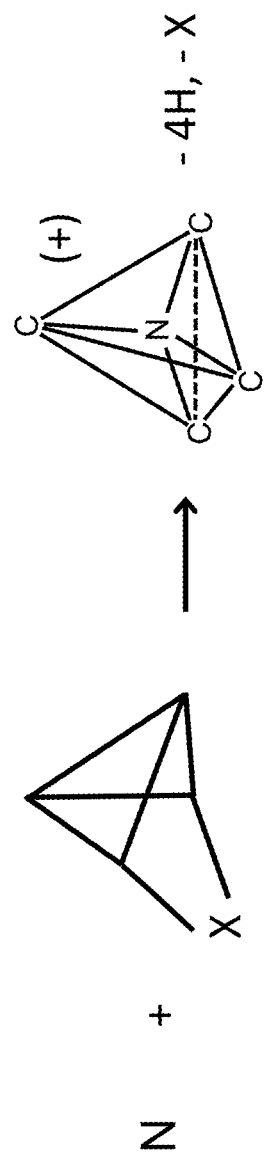

The aza-diamond unit cell reaction of FIG. 3(B) occurs in reaction chamber 106. Within reaction chamber 106, excited state nitrogen atom cloud 209 is shown mixing and reacting with benzvalene vapor 215. The resulting aza-diamond unit cells are conducted out of reaction chamber 106 through aza-diamond output conduit 220. The output flow of the aza-diamond unit cells through aza-diamond output conduit 220 is controlled by aza-diamond output valve 190, which is regulated by the systems controller 390 via control line 180, which connects to the systems controller 390 through main system bus 392 and controller bus 391. Aza-diamond unit cells are provided through aza-diamond output conduit 220 to manifold 112.

Manifold 112 can receive bora-diamond unit cells, homodiamond unit cells, and aza-diamond unit cells, singularly, or in any predetermined combinations of controlled proportions. During operation, concentrations of any of these three products can be kept constant or controllably varied in a predetermined sequence, according a program stored in the systems controller. The output of manifold 112 is through manifold output conduit 114, which control there through is regulated by manifold output valve 192. Manifold output valve 192 is controlled by the systems controller 390 via control line 198, which connects to the systems controller 390 through main system bus 392 and controller bus 391. Flow of unit cells out of manifold 112 can be stopped immediately by diverting the gaseous stream away from manifold output conduit 114 with a diversionary stream of inert gas (e.g., argon) that enters manifold output conduit 114 through diversion input port 116 and exits through diversion output port 118.

Figure 7:
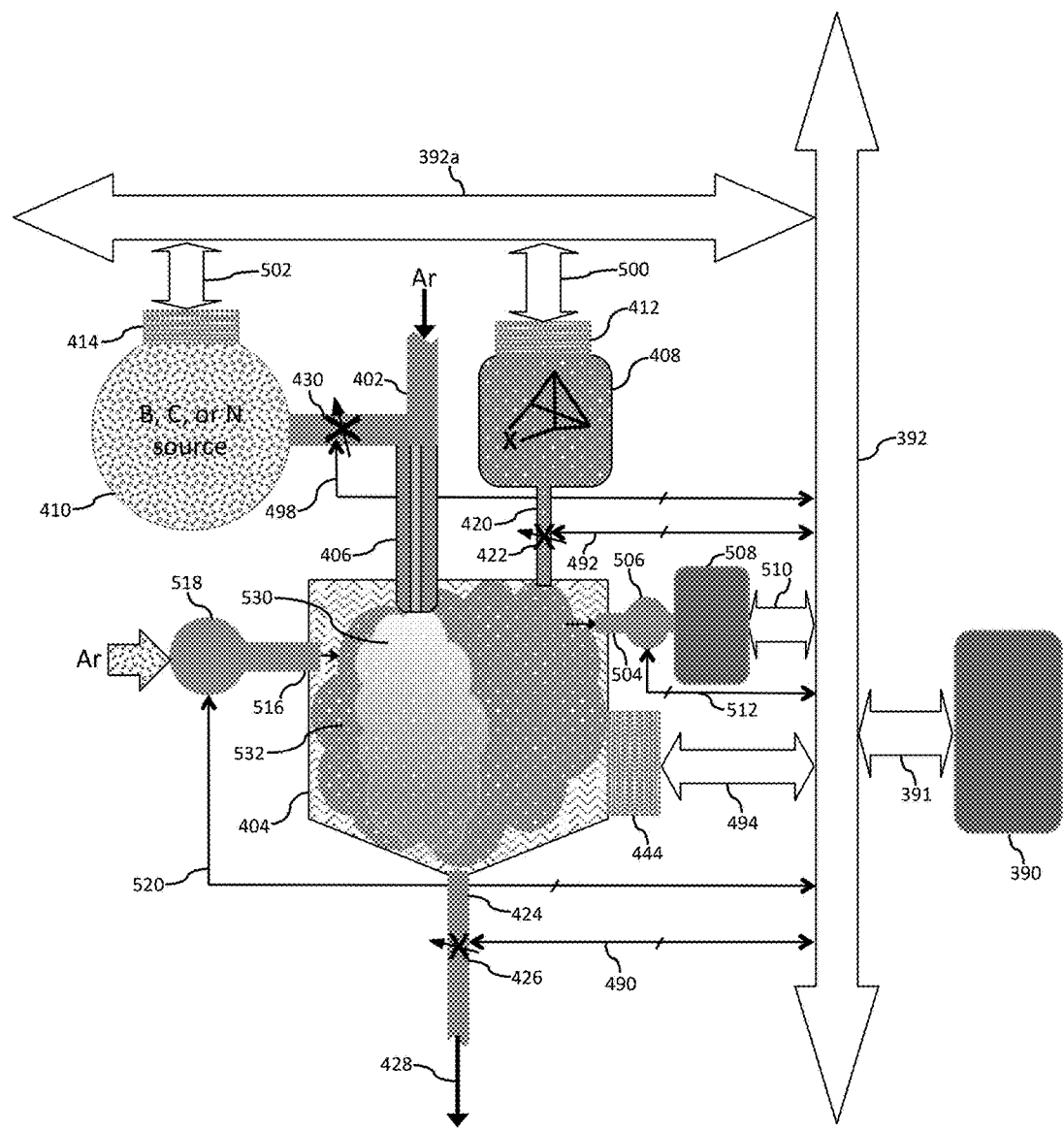
FIG. 7 is a schematic diagram with added detail of a portion of the integrated, controlled system for producing heterodiamond and homodiamond unit cells and a mixture of any combination thereof.

FIG. 7 provides greater detail of a portion of the apparatus of FIG. 6. The reaction between a highly excited boron, carbon, or nitrogen atom and a tetrahedranoidal molecule, such as benzvalene or tetrahedranone, occurs in reaction chamber 404. Atomic reactant source container 410 provides boron, carbon or nitrogen as highly excited atoms 530 to reaction chamber 404 through atomic reactant flow control valve 430 into conduit nozzle 406 where it converges and mixes with an inert carrier gas such as argon, which is introduced into conduit nozzle 406 through carrier gas conduit 402. Reaction chamber 404 can be flushed of all reactants and reaction byproducts by closing atomic reactant flow control valve 430 and allowing inert carrier gas to flow into reaction chamber 404. Inlet port 516, provides for an inflow of inert carrier gas (e.g., argon), which is provided to reaction chamber 404 under controlled flow and pressure by inlet pump 518. Inlet pump 518 is controlled by the systems controller 390 via control lines 520, which connects to the systems controller 390 through main system bus 392 and controller bus 391. Effluent leaves reaction chamber 404 through effluent port 504. As shown, effluent pump 506 controls flow of effluent from reaction chamber 404. There may be circumstances when effluent pump 506 is not used, and, thus, effluent exits reaction chamber 404 through effluent port 506 passively (e.g., due to the pressure from inlet pump 518) but through a controllable valve (not shown). Effluent pump 506 connects through to GC-MS 508 (gas chromatograph in tandem with a mass spectrometer), for effluent analysis. Effluent pump 506 may be separate from, or integrally a part of, GC-MS 508. When separate from mass GC-MS 508, effluent pump 506 is controlled by the system controller 390 through effluent pump control lines 512. When integrally a part of GC-MS 508, effluent pump 506 may be directly or indirectly controlled through GC-MS bus 510, which connects communicatively through to system controller 390 through main system bus 392 and controller bus 391.

Conduit nozzle 406 functions as an input port into reaction chamber 404 for highly excited boron, carbon, or nitrogen atoms within an inert carrier gas flow. Atomic reactant flow control valve 430, is controlled by systems controller 390 via control line 498, which connects to systems controller 390 through controller bus 391 and main system bus 392.

Tetrahedranoidal molecule source container 408 provides tetrahedranoidal molecules 532 in vapor phase to reaction chamber 404 through tetrahedranoidal reactant conduit 420 the flow of which is regulated by valve 422. Valve 422 is controlled by systems controller 390 via control line 492, which connects to systems controller 390 through controller bus 391 and main system bus 392. Product 428 of the reaction in reaction chamber 404, i.e., bora-diamond, homodiamond, or aza-diamond unit cells, exits through output conduit 424, which flow is regulated by output valve 426. Output valve 426 is controlled by systems controller 390 via control line 490, which connects communicatively to systems controller 390 through controller bus 391 and main system bus 392.

Reaction chamber 404 provides a controlled environment specifically intended to maintain the physical and chemical conditions conducive to the production of homodiamond and heterodiamond unit cells invention and to eliminate impurities formed by autogenous processes. Furthermore, physical and chemical conditions within tetrahedranoidal molecule source container 408 and atomic reactant source container 410 are also maintained so as to be conducive to the unit cell reactions of the present invention.

The physical and chemical conditions within reaction chamber 404 are maintained by sensor/actuator suite 444, which is controlled by the systems controller 390. Sensor/actuator suite 444 communicatively connects through to systems controller 390 via sensor/actuator bus 494, main system bus 392, and controller bus 391.

The physical and chemical conditions within tetrahedranoidal molecule source container 408 are maintained by sensor/actuator suite 412, which is controlled by systems controller 390. Sensor/actuator suite 412 communicatively connects through to systems controller 390 via sensor/actuator bus 500, main system bus extension 392a, main system bus 392, and controller bus 391.

The physical and chemical conditions within atomic reactant source container 410 are maintained by sensor/actuator suite 414, which is controlled by systems controller 390. Sensor/actuator suite 414 communicatively connects through to systems controller 390 via sensor/actuator bus 502, main system bus extension 392a, main system bus 392, and controller bus 391.

If it is desired to use the apparatus of FIGS. 6 and 7 with the reactions of FIGS. 1A, 3A, and 4A, that is, reactions that include what we believe to be tetrahedrane (as the tetrahedranoidal molecule), some modifications to the apparatus are necessary. In particular, tetrahedranoidal reactant conduits 210, 212, and 214 of FIG. 6 and tetrahedranoidal reactant conduit 420 of FIG. 7 must be modified to include a heated catalytic frit so that acetylene can be converted to what we believe to be tetrahedrane. Thus, acetylene is sourced to the heated catalytic frit from tetrahedranoidal molecule source containers 108 and 110 of FIG. 6 and tetrahedranoidal molecule source container 408 of FIG. 7. The acetylene is provided within an inert carrier gas such as argon.

Reaction chambers 104 and 106 of FIG. 6 are shown sharing the same tetrahedranoidal molecule source container 110. If it is desired to use a different tetrahedranoidal molecule in reaction chamber 104 from that of reaction chamber 106, each chamber can be provided with its own tetrahedranoidal molecule source container and tetrahedranoidal reactant conduit.

Particularly in the case where more than one type of unit cell (bora-diamond, aza-diamond, homodiamond, or any mixture thereof) is produced using the apparatus of FIGS. 6 and 7, manifold 112 can be adapted to perform mixing to provide a uniform mixture of the unit cells. Alternatively, other means known in the gas mixing art can be used.

Figure 8:
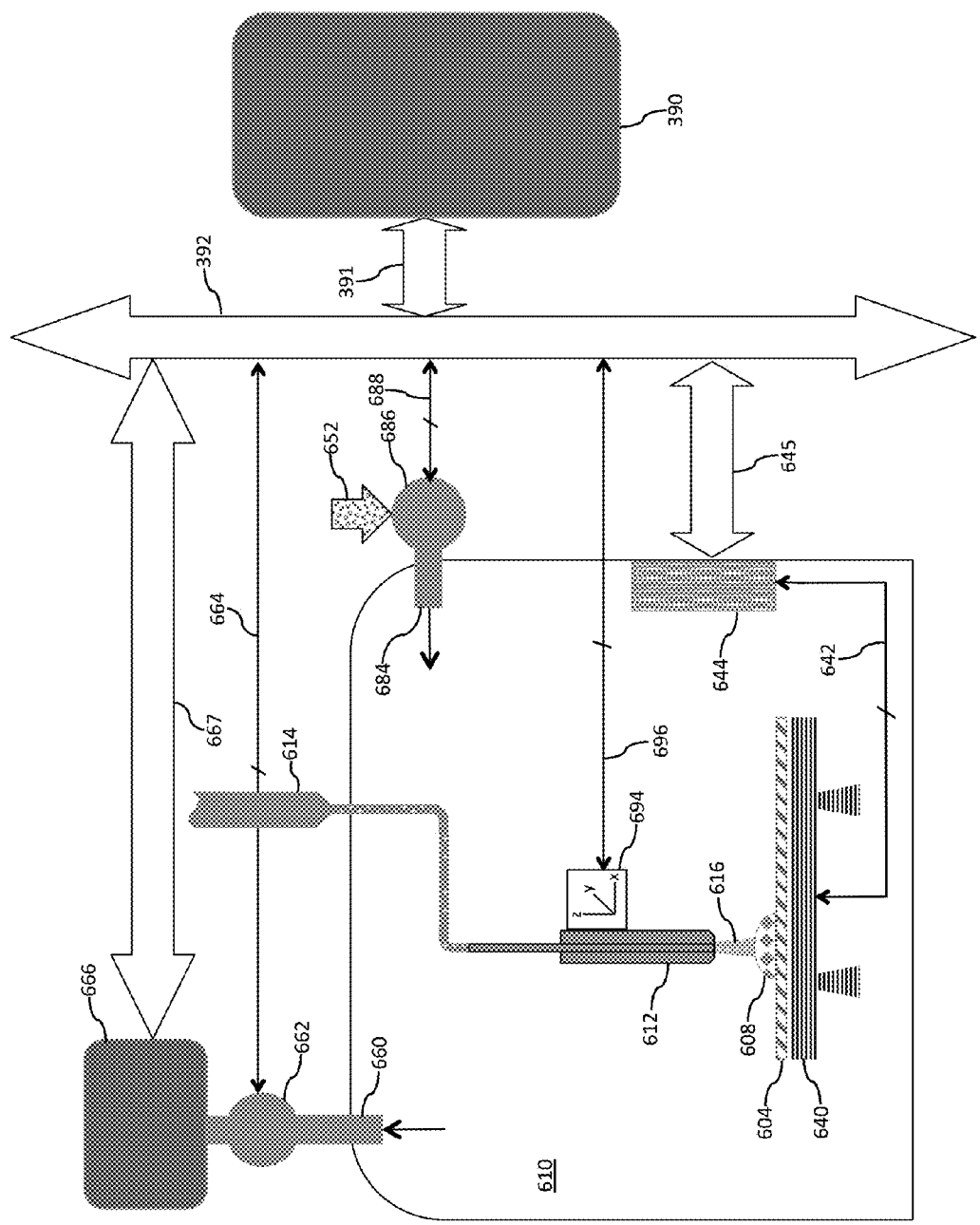
FIG. 8 is a schematic diagram of a deposition chamber adapted to receive heterodiamond and homodiamond unit cells and a mixture of any combination thereof from the integrated, controlled system of FIGS. 6 and 7.

FIG. 8 shows an exemplary use of the homodiamond unit cell and heterodiamond unit cell products of the apparatus of FIGS. 6 and 7. Deposition chamber 610 provides a controlled environment specifically intended to maintain the physical and chemical conditions conducive to the production of molecular diamond (i.e., the homodiamond unit cell and the heterodiamond unit cell) to yield useful, shapeable diamond masses that can be components of products or products themselves. As shown, work piece holder 640 supports deposition substrate 604. Although only one work piece holder 640, is shown, a plurality of work piece holders with associated deposition substrates in a single deposition chamber 610 can be accommodated by the present invention. Work piece holder 640 includes a means for locally controlling the temperature and charge of the deposition substrate 604, the details for which are not shown. Temperature control lines 642 communicate data to and from the system controller 390 through sensor/actuator suite and interface 644, through sensor bus 645, main system bus 392, and controller bus 391. Sensor/actuator suite and interface 644, contains one or more temperature sensors and one or more pressure sensors. It can accommodate additional sensors. Although sensor/actuator suite and interface 644 is shown as a single, integrated module at one location in deposition chamber 610, alternatively, the sensors can be placed at disparate locations within deposition chamber 610. Sensor/actuator suite and interface 644 communicates data to and from the system controller 390 through sensor/actuator bus 645, main system bus 392, and controller bus 391. Inlet port 684 provides for an inflow of inert carrier gas 652. Deposition chamber 610 may be pressurized by inlet pump 686 under the control of inlet pump control lines 688. Inlet pump 686 may be provided with dedicated flow sensor or sensors (preferably non-contact sensors) and/or pressure sensors that are not shown. Inlet pump control lines 688 communicate with system controller 390 through main system bus 392 and controller bus 391. It is also possible to maintain desired flow and pressure in deposition chamber 610 using the pressure of the inert carrier gas 652 storage tank and its regulator alone, making the inlet pump 686 unnecessary.

Effluent leaves deposition chamber 610 through effluent port 660. As shown, effluent pump 662 controls flow of effluent from deposition chamber 610. There may be circumstances when effluent pump 662 is not used, and, thus, effluent exits deposition chamber 610 through effluent port 660 passively (e.g., due to the pressure) but through a controllable valve (not shown). Effluent pump 662 connects through to GC-MS 666 (gas chromatograph in tandem with a mass spectrometer) for effluent analysis. Effluent pump 662 may be separate from or integrally a part of GC-MS 666. When separate from mass GC-MS 666, effluent pump 662 is controlled by the system controller 390 through effluent pump control lines 664. When integrally a part of GC-MS 666, effluent pump 662 may be directly or indirectly controlled through GC-MS bus 667, which connects communicatively through to system controller 390 through main system bus 392 and controller bus 391.

Unit cell inlet 614 provides homodiamond unit cells and/or heterodiamond unit cells, or any combination thereof, to deposition chamber 610. As shown, unit cell inlet 614 is an extension of manifold output conduit 114 of FIG. 6 or output conduit 424, of FIG. 7. The unit cells passing through unit cell inlet 614 are provided to delivery apparatus 612 through which they pass and are controllably directed at a predetermined location on deposition substrate 604. Unit cell stream 616 deposits unit cell mass 608 on deposition substrate 604. Unit cell stream 616 can comprise homodiamond unit cells, heterodiamond unit cells, or a mixture thereof. Unit cell mass 608 can be a localized mass (as shown) or a diffuse, uniform mass such as a thin film on deposition substrate 604. The relative position of delivery apparatus 612 is controlled by three dimensional position controller 694 (details not shown). Three dimensional position controller 694 is, in turn, controlled through position control lines 696, which communicate through to the systems controller 390 through main system bus 392 and controller bus 391. A single deposition chamber 610 can also accommodate multiple reactant delivery apparatuses. Delivery apparatus 612 can be configured as a simple port to deliver a generally diffuse cloud of unit cells within deposition chamber 610 for a uniform deposition of homodiamond unit cells, heterodiamond unit cells, or a mixture thereof on one or more deposition substrates 604.

Figure 5:
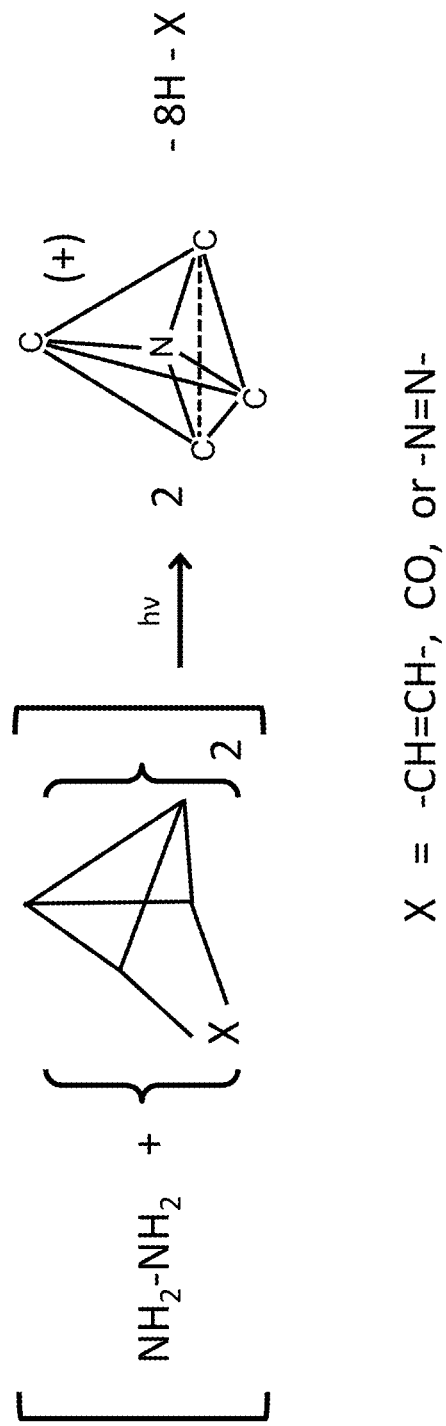
FIG. 5 depicts a solid state reaction for forming aza-diamond.
Figure 9:
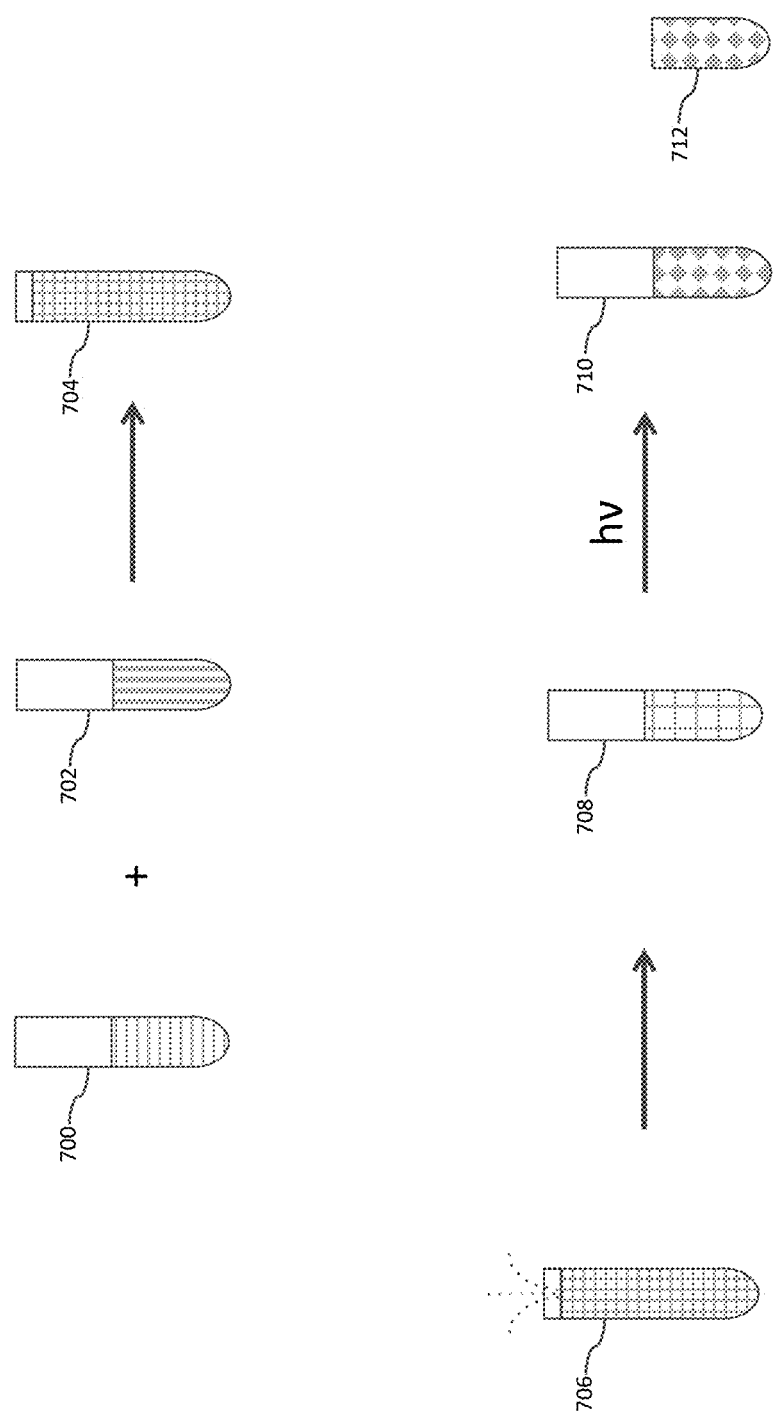
FIG. 9 illustrates a process for producing an aza-diamond mass using a solid state reaction.

The solid state reaction formula shown in FIG. 5 uses hydrazine as the source for highly excited nitrogen atoms. FIG. 9 is a schematic that shows the formation of aza-diamond using this solid state reaction. A solution of benzvalene 700 and a solution of hydrazine 702 are combined to form a homogeneous solution 704 of benzvalene and hydrazine in a proportion of benzvalene to hydrazine of 2:1. The solutions can be made in an organic solvent such as diethyl ether. The homogeneous solution 706 undergoes evaporation to form a homogeneous solid mixture 708 of benzvalene and hydrazine in a proportion of 2:1 respectively. Homogeneous solid mixture 708 is subjected to a high energy discharge (e.g., microwave) to yield aza-diamond mass 710. Once removed from its container, aza-diamond mass 712 retains the shape defined by the container. This reaction can be adapted for use with apparatus similar to that shown in FIGS. 8 and 10 of US 2015/0259790, which is fully incorporated herein by reference. For example, this can be achieved by substituting a homogeneous solution of hydrazine and benzvalene for the homogeneous solution of cubane and benzvalene, which is disclosed in US 2015/0259790. When using this apparatus to produce aza-diamond using the solid state reaction, sensors, actuators and control parameters of the systems controller are adjusted to be conducive to the reaction.

The disclosed apparatus for producing bora-diamond, aza-diamond, and homodiamond unit cells is versatile. For example, unit cells exiting from manifold output conduit 114 of FIG. 6 or output valve 426 of FIG. 7 can be used to build up thin films or layers of bora-diamond, aza-diamond, and homodiamond masses or masses comprising any combination mixed heterodiamond and/or homodiamond unit cells on a deposition substrate such as deposition substrate 604 of FIG. 8. Another exemplary use of bora-diamond, aza-diamond, and homodiamond unit cells, or various combinations thereof of the present invention, is as a dopant for other materials such as silicon, compound semiconductors, etc. As a dopant, it is the heterodiamond or homodiamond unit cell that is the dopant species, not the heteroatom per se. For example, the bora-diamond unit cell and/or the aza-diamond unit cell can be the dopant species.

As in U.S. Pat. Nos. 8,778,295 and 9,061,917, the choice of substrate is not critical, and it is not necessary to heat the substrate as the energy of the substrate does not participate in the heterodiamond unit cell reaction. However, the heterodiamond unit cells so produced are charge monopoles (unipolar) having no associated species bearing charges of opposite sign (counter charges). For this reason, it can be beneficial to impress a charge of opposite sign onto the deposition substrate to minimize the potential for like charge repulsion phenomenon. Impressing a charge on a deposition substrate, that is, biasing a substrate is known in the art of semiconductor manufacturing. For example, in U.S. Pat. No. 5,145,712, Jesser et al. disclose the chemical deposition of diamond crystals on a substrate whose positive charge is achieved with a substrate bias supply. In U.S. Pat. No. 5,310,703, Visser et al. disclose a method of manufacturing a semiconductor device in which photoresist on a silicon oxide layer on a semiconductor substrate is stripped using an oxygen plasma afterglow and a biased substrate. In JP 2001148487, Nishioka et al. disclose a manufacturing method for silicon thin film solar batteries wherein a substrate can be biased negatively or positively.

The Control System

The control system of the apparatus comprises a computer system in combination with hardware interfaces for sensor input data and output control signals for actuators. Control system software for the computer is designed with a modular structure, although other schemes are also possible. Process control can employ previously determined, preferred parameters that are stored in memory maps for use with process control strategies such as closed-loop, fuzzy logic, etc., which are commercially available. The general structure applies to both vapor phase and solid state embodiments of the present invention. Generally, data are received from sensors in the apparatus and processed by the control system. When data indicate that a specific parameter's value has diverged from the desired set point, control signals are generated by the computer and routed through the control system interface to actuators in the apparatus. These signals correct for the difference between the actual measured parameter value and the target or desired value for that parameter.

Thus, for example, the internal temperature and pressure of a reaction chamber or deposition chamber can be set to preferred values by adjusting the inert carrier gas temperature and/or flow rate based on the data received from temperature and pressure sensors. The inert gas can be, for example, argon gas with less than three parts per million $O_2$, which is commercially available. Thus, the gas entering a reaction chamber first passes through a refrigeration device that includes a pump and one or more heat exchangers. The temperature of the inert gas is controlled by varying the heat exchanger's refrigerant temperature, which is managed by the system controller. The reaction chamber temperature is measured by one or more temperature sensors and the temperature data are provided to the system controller. One temperature sensor can be placed on a wall of the reaction chamber. Another one or two can be placed on or near the gas input port or ports of the reaction chamber. Depending on the embodiment, temperature can also be measured with a temperature sensor disposed on or near the reactant nozzle or dispenser. If additional temperature control is desired, the work piece holder that holds the deposition substrate can be placed in intimate contact with a dedicated heat exchanger for heating and cooling the deposition substrate as required by the chosen process. Such a dedicated heat exchanger can have its own thermal fluid that is separate from that of the inert gas heat exchanger. Such apparatuses and their associated control systems are commercially available. The associated control system of the substrate heat exchanger is under the command and control of the general system controller.

The pressure in a reaction chamber and deposition chamber can be controlled over a very wide range of values from fractions of an atmosphere up to many atmospheres. This is achieved by a combination of options that include using the high pressure of the inert gas in its storage cylinder or tank (passive pressure control) and/or an additional pressure pump in combination with a vacuum pump at the effluent port of the reaction chamber (active pressure control). Typically, when pressurized gas from a high pressure tank is provided to the reaction chamber or deposition chamber, it flows through a gas pressure regulator, which provides a "step-down" in pressure as a first order of pressure control. Additional control is achieved through the use of a pressure sensor or sensors that are disposed within the reaction chamber. For example, one pressure sensor can be placed on the reaction chamber wall but local to the general deposition area. In the placement of sensors, care is taken to avoid gas currents. If the reaction is performed at sub-atmospheric temperatures, a vacuum pump is used to maintain the lower pressure at the same time that inert gas continues to flow into the reaction chamber. If the reaction is performed above atmospheric pressures, passive pressure control (e.g., regulated tank pressure) and/or in combination of passive and active pressure control can be used. A valve can be used at the effluent port to control egress of the effluent gas.

Regardless of the pressure conditions chosen for a particular reaction, flow into, through, and out of a reaction chamber or deposition chamber must be maintained. A controllable manifold can be used to provide kinetic energy to the gases to drive the heterodiamond and homodiamond forming reactions. By manipulating the gas regulator, inert gas pump, vacuum pump, and/or effluent valve based on temperature and pressure sensor data, the control system is able to set the preferred conditions for heterodiamond and homodiamond unit cell formation.

In vapor phase embodiments of the present invention, flow control may be achieved with a non-contact flow sensor or sensors (e.g., ultrasonic flow sensor) in the inert gas input port or ports of reaction chamber. These sensors can be embedded in the walls of the conduits or nozzles. The feedback control loop for controlling flow is regulated by the system controller through a reactant gas pump and/or a throttling valve. In solid state embodiments, precise amounts of homogeneous reactant solution can be delivered or dispensed by the use of well-calibrated metering pumps.

Effluent ports are generally attached to the input port of a GC-MS spectrometer, which often has its own controllable pump system. The GC-MS spectrometer can monitor effluent either continually or periodically and provide effluent content data to the system controller. Process control may be based upon compositional data, physical parameter data, relative positional data, morphological data of the molecular diamond mass, etc. Mass spectrometer software is available both commercially and as open source programs that can be easily used in combination with the control system of the present invention.

For solid state embodiments of the present invention, three-dimensional positioning of dispensers (e.g., automated pipetting systems), printing devices and other actuators and control systems therefor are well-developed technologies. A wide range of products for accomplishing the manufacturing processes shown in FIGS. 6-8 of US 2015/0259790, which is fully incorporated herein by reference, are available commercially and can be adapted to work in combination, and interface, with the control system of the present invention. For example, the reactant delivery apparatuses of FIGS. 6-8 of US 2015/0259790 can be achieved using three-dimensional positioning devices (e.g., a 3 D printer gantry, etc.) and their associated control software.

The control system software for the present invention not only maintains preferred reaction conditions but also controls the proper sequence of events. For example, the switchable high-energy discharge apparatus can be actuated on and off depending on the effluent data provided by the mass spectrometer. The control system software can be written in a variety of programming languages, but it is particularly useful to use languages that provide bit-level addressing and manipulation, such as C or C++, because these allow for easy interfacing with input and output ports (e.g., reading from or writing to A/D and D/A converters directly, respectively). Otherwise, interface routines can be coded in assembly language and control processing can be done in a higher level language. Alternatively, instrument control software development systems are available commercially (e.g., LabVIEW or LabWindows/CVI from National Instruments) that can be adapted to develop the control system software for the present invention.

What is claimed is:

1. A combinatorial synthesis of a heteroatom-containing five atom molecule, comprising one heteroatom and four carbon atoms, wherein four atoms are inter-bonded to form a tetrahedral molecule with a fifth atom centrally located in the tetrahedral molecule, which synthesis comprises a step of reacting a tetrahedranoidal molecule with a heteroatom to form the heteroatom-containing five atom inter-bonded molecule, at a pressure and temperature which do not promote autogenous decomposition of the tetrahedranoidal molecule prior to reaction with the heteroatom;
wherein said heteroatom is generated from a heteroatom-containing molecule, selected from the group consisting of ammonia, hydrazine, and diborane, under high energy discharge, and then transported in an inert gas and into a vapor of a tetrahedranoidal molecule, resulting in inclusion of the generated heteroatom from the heteroatom-containing molecule into the tetrahedranoidal molecule, thereby forming the heteroatom-containing five atom molecule.

2. The combinatorial synthesis of claim 1, wherein the tetrahedranoidal molecule is benzvalene, 3,4-diazabenvalene or 2,3,4-methynylcyclobutanone.

3. The combinatorial synthesis of claim 1, which is conducted at a temperature of not more than 80° C.

4. The combinatorial synthesis of claim 1, wherein said heteroatom is atomic nitrogen.

5. The combinatorial synthesis of claim 4, wherein said atomic nitrogen is obtained from a nitrogen-containing species in vapor phase by exposing said species to a high-energy discharge, and wherein said nitrogen-containing species is hydrazine or ammonia, and said tetrahedranoidal molecule is benzvalene or 2,3,4-methynyl-cyclobutanone, and said combinatorial synthesis is in the vapor phase.

6. The combinatorial synthesis of claim 4, wherein said atomic nitrogen is obtained from a nitrogen-containing species in solid state by exposing said species to a high-energy discharge, and wherein said nitrogen-containing species is hydrazine, and said tetrahedranoidal molecule is benzvalene, 3,4-diazabenzvalene or 2,3,4-methynyl-cyclobutanone, and said combinatorial synthesis is in the solid state.

7. The combinatorial synthesis of claim 4, wherein a homogeneous blend of the tetrahedranoidal molecule and the heteroatom source is a nitrogen source and is subjected to a high energy discharge.

8. The combinatorial synthesis of claim 1, wherein the heteroatom is atomic boron.

9. The combinatorial synthesis of claim 8, wherein atomic boron is obtained from a boron-containing species in vapor phase by exposing said species to a high energy discharge, and wherein the boron-containing species is diborane, and said tetrahedranoidal molecule is 2,3,4-methynyl-cyclobutanone (tetrahedranone), with said combinatorial synthesis occurring in the vapor phase.

10. The combinatorial synthesis of claim 1, wherein a heterodiamond mass is formed from an assembly of a plurality of heteroatom-containing five atom molecules, each of the five atom molecules containing one heteroatom and four carbon atoms.

11. The combinatorial synthesis of claim 1, which comprises obtaining heteroatoms from a heteroatom source by vaporizing said heteroatom source in an inert carrier gas and exposing said heteroatom source in the inert carrier gas to a high energy discharge, directing the heteroatoms so obtained to a reaction chamber, directing flow of tetrahedranoidal molecules in an inert carrier gas into said reaction chamber, and combining said heteroatoms with said tetrahedranoidal molecules to form the heteroatom-containing five atom inter-bonded molecules.

12. The combinatorial synthesis of claim 1, which further comprises forming heterodiamond mass from a plurality of the heteroatom-containing five atom inter-bonded molecules.

13. The combinatorial synthesis of claim 1, wherein a stoichiometric excess of tetrahedranoidal molecules with respect to heteroatom-containing species is used to ensure that all of the heteroatoms from the heteroatom-containing species are consumed by formation of the heteroatom-containing five atom inter-bonded molecules.

14. The combinatorial synthesis of claim 1, which does not use diamond seed or heterodiamond seed.

15. The combinatorial synthesis of claim 11, wherein the inert carrier gas is a noble gas.

16. The combinatorial synthesis of claim 15, wherein the noble gas is argon.

17. The combinatorial synthesis of claim 1, wherein said pressure is from 1 to 2 atmospheres.

18. The combinatorial synthesis of claim 1, wherein said reaction temperature is no higher than the vaporization or decomposition temperature of the tetrahedranoidal molecule.

19. The combinatorial synthesis of claim 18, wherein said reaction temperature is no higher than 80° C. when the tetrahedranoidal molecule is benzvalene.

20. The combinatorial synthesis of claim 19, wherein said reaction temperature is from between 77° C.-80° C.

21. The combinatorial synthesis of claim 18, wherein said reaction temperature is no higher than about 37° C. when the tetrahedranoidal molecule is tetrahedranone (2,3,4-methynylcyclobutanone.

22. The combinatorial synthesis of claim 21, wherein said reaction temperature is about 37° C.

23. The combinatorial synthesis of claim 21, wherein the heteroatom-containing five atom inter-bonded molecule is tetrahedron-shaped.

24. The combinatorial synthesis of claim 18, wherein said reaction temperature is no higher than −60° C. when the tetrahedranoidal molecule is 3,4-diazabenzvalene.

25. The combinatorial synthesis of claim 1, wherein the five atom molecule has four carbon atoms located at apices of the tetrahedral molecule and the heteroatom located centrally within the tetrahedral molecule.

26. The combinatorial synthesis of claim 1, wherein the five atom tetrahedral molecule has three carbon atoms located at apices of the tetrahedral molecule, a fourth carbon atom located centrally within the tetrahedral molecule, and the heteroatom located at an apical position of the tetrahedral molecule.

27. The combinatorial synthesis of claim 1, wherein the heteroatom containing the five atom tetrahedral molecule is synthesized in vapor phase.

28. The combinatorial synthesis of claim 1, wherein the heteroatom containing five atom tetrahedral molecule is synthesized in solid state.

29. The combinatorial synthesis of claim 1, wherein the heteroatom is N.

30. The combinatorial synthesis of claim 1, wherein the heteroatom is B.

31. A combinatorial synthesis of a heteroatom-containing five atom molecule, comprising one heteroatom and four carbon atoms, wherein four atoms are inter-bonded to form a tetrahedral-shaped molecule with a fifth atom centrally located in the tetrahedral-shaped molecule, which synthesis comprises a step of reacting a tetrahedranoidal molecule with a heteroatom to form the heteroatom-containing five atom inter-bonded molecule, at a pressure and temperature which do not promote autogenous decomposition of the tetrahedranoidal molecule prior to reaction with the heteroatom;

wherein said heteroatom is generated from a heteroatom-containing molecule under high energy discharge, and then transported in inert gas and into a vapor of a tetrahedranoidal molecule, resulting in inclusion of the generated heteroatom into the tetrahedranoidal molecule, thereby forming the heteroatom-containing five atom molecule; and wherein said tetrahedranoidal molecule is selected from the group consisting of benzvalene and 2,3,4-methynylcyclobutanone.

32. The combinatorial synthesis of claim 31, wherein said tetrahedranoidal molecule is benzvalene.

33. The combinatorial synthesis of claim 31, wherein said tetrahedranoidal molecule is 2,3,4-methynylcyclobutanone.

34. A combinatorial synthesis of a nitrogen atom-containing five atom molecule, comprising one nitrogen atom and four carbon atoms, wherein four atoms are inter-bonded to form a tetrahedral-shaped molecule with a nitrogen atom centrally located in the tetrahedral-shaped molecule, which synthesis comprises a step of reacting a 3,4-diazabenvalene molecule with a nitrogen atom to form the nitrogen atom-containing five atom inter-bonded molecule at a pressure and temperature which do not promote autogenous decomposition of the 3,4-diazabenzvalene prior to reaction with the nitrogen atom; and wherein said nitrogen atom is generated from molecular nitrogen under high energy discharge, and then transported in an inert gas and into a vapor of a 3,4-diazabenvalene molecule, resulting in inclusion of the generated nitrogen atom into the 3,4-diazabenzvalene molecule by the combinatorial synthesis, thereby forming the nitrogen atom-containing five atom molecule.

* * * * *